United States Patent
Polyak

(10) Patent No.: US 8,899,408 B2
(45) Date of Patent: Dec. 2, 2014

(54) TEMPERATURE ACTUATED TENSIONING MECHANISM

(71) Applicant: Applied Materials, Inc., Santa Clara, CA (US)

(72) Inventor: Alexander S. Polyak, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/956,631

(22) Filed: Aug. 1, 2013

(65) Prior Publication Data
US 2014/0034454 A1 Feb. 6, 2014

Related U.S. Application Data

(60) Provisional application No. 61/679,156, filed on Aug. 3, 2012.

(51) Int. Cl.
*B65G 23/44* (2006.01)
*B65G 15/60* (2006.01)
*H01L 31/18* (2006.01)

(52) U.S. Cl.
CPC ............... *B65G 15/60* (2013.01); *B65G 23/44* (2013.01); *H01L 31/18* (2013.01)
USPC ............................ 198/814; 474/109; 474/117

(58) Field of Classification Search
CPC ................................... B65G 23/44; F16H 7/08
USPC .......... 198/814; 474/101, 109, 111, 115, 117, 474/138
See application file for complete search history.

(56) References Cited

U.S. PATENT DOCUMENTS

| | | | |
|---|---|---|---|
| 3,783,429 A | | 1/1974 | Otte |
| 4,473,362 A | * | 9/1984 | Thomey et al. ............... 474/115 |
| 4,573,952 A | | 3/1986 | Schulze |
| 4,678,354 A | * | 7/1987 | Olsen ............................ 474/117 |
| 4,899,427 A | | 2/1990 | Gresens |
| 5,121,950 A | | 6/1992 | Davidian |
| 5,647,812 A | | 7/1997 | McDonald et al. |
| 6,106,423 A | | 8/2000 | White et al. |
| 6,162,141 A | * | 12/2000 | Rointru et al. ................ 474/109 |
| 6,609,985 B2 | | 8/2003 | Todd et al. |

(Continued)

FOREIGN PATENT DOCUMENTS

EP    189735   * 12/1985   ................... 198/814

*Primary Examiner* — James R Bidwell
(74) *Attorney, Agent, or Firm* — Patterson & Sheridan, LLP

(57) ABSTRACT

Aspects of the present invention generally provide tensioner for varying tension applied to a continuous drive member based on temperature changes. In one embodiment, a temperature compensating chain tensioner is provided. The temperature compensating chain tensioner includes a fixed support member, a first idler sprocket coupled to the fixed support member, a support arm having a proximal end pivotably coupled to the fixed support member, a second idler sprocket coupled to a distal end of the support arm, and a spring form coupled intermediate of the fixed support member and the support arm, wherein the spring form has a spring constant that increases with increasing temperature, which causes the distal end of the support arm to move relative to the fixed support member.

20 Claims, 5 Drawing Sheets

(56) References Cited

U.S. PATENT DOCUMENTS

| | | | |
|---|---|---|---|
| 6,817,328 B2 * | 11/2004 | Buglione et al. | 474/109 |
| 6,843,365 B2 * | 1/2005 | Baker | 198/813 |
| 8,052,558 B2 | 11/2011 | Markley | |
| 8,066,598 B2 | 11/2011 | Bulloch | |
| 8,083,623 B2 | 12/2011 | Cantatore et al. | |
| 2007/0155556 A1 | 7/2007 | Jenni et al. | |
| 2008/0039942 A1 * | 2/2008 | Bergeron | 623/17.16 |
| 2009/0135019 A1 * | 5/2009 | Smith | 198/814 |

\* cited by examiner

TEMPERATURE ACTUATED TENSIONING MECHANISM

CROSS-REFERENCE TO RELATED APPLICATIONS

This application claims benefit of U.S. Provisional Patent Application Ser. No. 61/679,156, filed Aug. 3, 2012, which is hereby incorporated by reference herein.

BACKGROUND OF THE INVENTION

1. Field of the Invention

Embodiments of the invention generally relate to an apparatus and method for minimizing slack in continuous drive members, such as chains, belts, cables, and the like, in variable temperature environments. Embodiments of the invention may be utilized in apparatus for the forming of layers on a substrate used to form electronic devices, such as a solar cell device.

2. Description of the Related Art

In the manufacture of electronic devices, such as photovoltaic (PV) or solar cells, circuits are formed on substrates in process chambers that are cycled between room temperature (e.g., about 20 degrees Celsius (C) to about 25 degrees C.) and processing temperatures, such as about 300 degrees C., or greater. In some of the circuit formation processes, substrates are transferred into and through the process chambers on conveyors utilizing one or more continuous drive members that facilitate movement of the conveyor and substrates thereon. The continuous drive members may be a belt, a chain, a cable, as examples, which are made of metallic materials chosen for mechanical strength, as well as other criteria, when used in these variable temperature environments.

However, the continuous drive members are subject to elongation in the variable temperature environments due to coefficients of thermal expansion associated with the specific material of the drive member. The elongation in the drive member produces slack, which may cause the drive member to slip or otherwise lose the ability to provide a controllable drive function. The elongation may also shorten service life in the drive member as well as other parts that facilitate movement of the drive member, such as sprockets, pulleys or sheaves.

Conventional tensioners may be used to mitigate the slack. However, conventional tensioners that may be used in variable temperature environments exert a substantial tensional force on the drive member at room temperature, which applies an unnecessary load on the drive member. The excessive load may shorten service life in the drive member as well as other parts that facilitate movement of the drive member. Additionally, an increase in the temperature of these conventional tensioners tends to reduce the spring constant in these conventional tensioners, which impedes or may even prevent proper tensioning of the drive member at higher temperatures.

Therefore, there is a need for an improved tensioner that facilitates controllable operation of the drive member as well as extending the service life of the drive member.

SUMMARY OF THE INVENTION

Aspects of the present invention generally provide tensioner for varying tension applied to a continuous drive member, wherein the continuous drive member undergoes temperature changes. In one embodiment, a temperature compensating chain tensioner is provided. The temperature compensating chain tensioner includes a fixed support member, a first idler sprocket coupled to the fixed support member, the first idler sprocket adapted to contact a continuous drive member, a support arm having a proximal end pivotably coupled to the fixed support member, a second idler sprocket coupled to a distal end of the support arm, and a spring form coupled intermediate of the fixed support member and the support arm, wherein the spring form has a shape that changes with temperature, which causes the distal end of the support arm to move relative to the fixed support member to maintain contact between the continuous drive member and the second idler sprocket when the temperature of the continuous drive member, the second idler sprocket and the spring form increases.

In another embodiment, a solar cell processing system is provided. The system includes a substrate automation system having one or more conveyors that are configured to transfer substrates serially through a processing region in a first direction. Each of the one or more conveyors comprises a continuous drive member supported by two or more rollers, and a tensioner in communication with the continuous drive member that varies tension on the continuous drive member based on temperatures experienced by the conveyor(s) in the processing region.

In another embodiment, a method for processing one or more substrates is provided. The method includes transferring one or more substrates disposed on a continuous drive member through a processing region in a processing chamber, and varying a tensional force applied to the continuous drive member based on temperature changes experienced by the continuous drive member in the processing region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures. It is contemplated that features of one embodiment may be incorporated in other embodiments without further recitation.

DETAILED DESCRIPTION

Embodiments of the invention generally relate to apparatus and methods for minimizing slack in continuous drive members, such as chains, belts, cables, and the like, in environments where temperature variations are encountered and/or temperature variations within the continuous drive members, or components thereof, may occur. An inventive tensioner device is described herein to facilitate tensioning of a continuous drive member that may be used in a conveyor or other automated equipment in a variable temperature environment. Embodiments of the tensioner device described herein may be utilized in apparatus for the forming of layers on a substrate in variable temperature environments where the temperature may fluctuate between room temperature (e.g., about 20 degrees Celsius (C) to about 25 degrees C.) and processing temperatures of about 300 degrees C., or greater. However, embodiments of the invention may be used in other apparatus or automation devices for other processes. Further, embodiments of the invention may be used in other apparatus where temperatures may vary between low temperature extremes (e.g., 0 degrees C., or below) to room temperature, or greater.

Exemplary embodiments of the invention will be described in the context of use in a processing system for forming thin films on substrates as part of a substrate automation system. The tensioner device for tensioning continuous drive members may be used with the substrate automation system for transporting substrates in the processing chambers, as well as peripheral and/or support chambers and transfer devices, utilized in a high throughput processing system. The processing chambers may be, for example, plasma enhanced chemical vapor deposition (PECVD) chambers, low pressure chemical vapor deposition (LPCVD) chambers, atomic layer deposition (ALD) chambers, physical vapor deposition (PVD) chambers, thermal processing chambers (e.g., RTA or RTO chambers), substrate reorientation chambers (e.g., flipping chambers) and/or other similar processing chambers.

Figure 1:
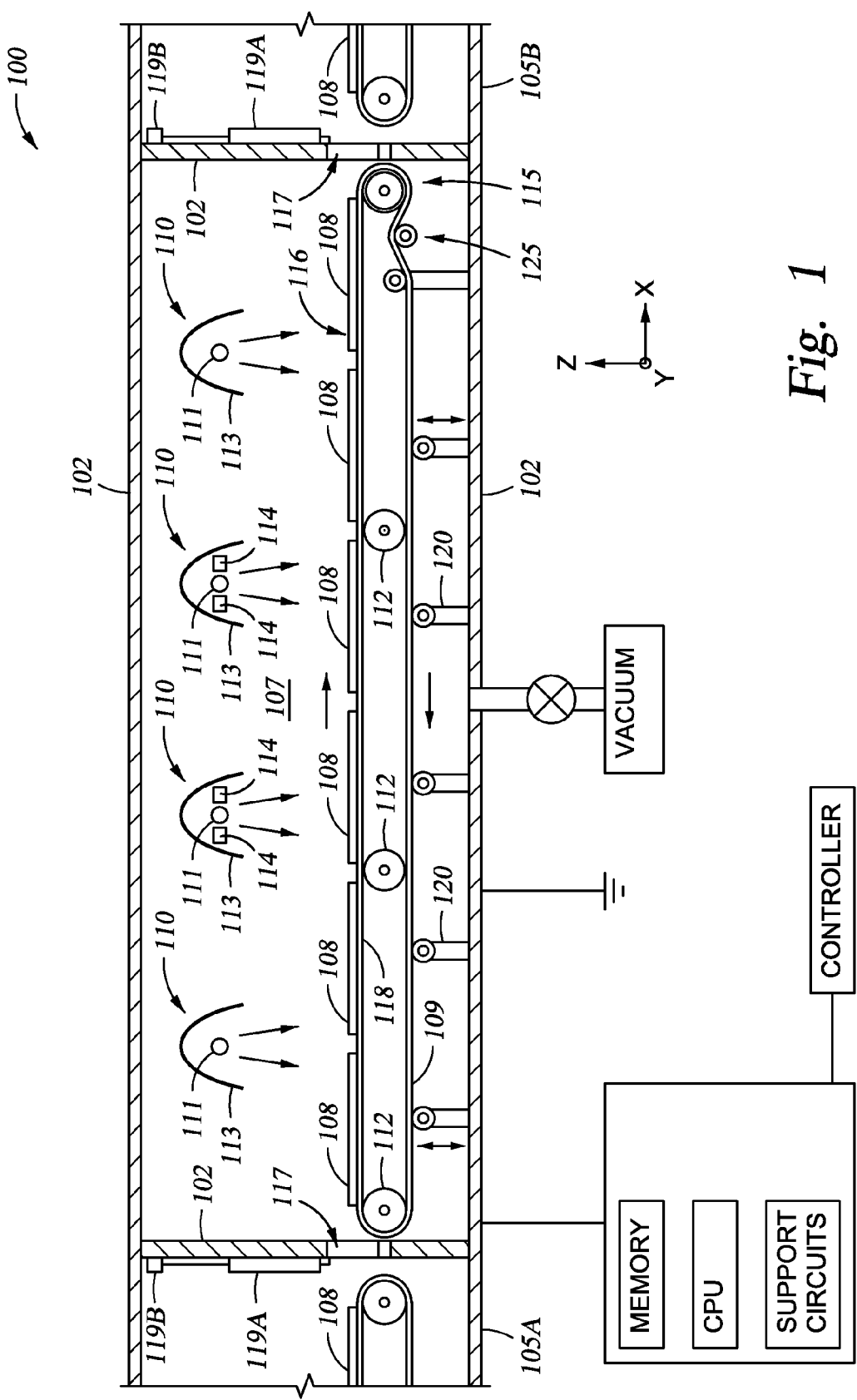
FIG. 1 is a side cross-sectional view of one embodiment of a processing chamber.

FIG. 1 is a side cross-sectional view of one embodiment of a processing chamber 100 that may form one or more processing chambers in a processing system. Peripheral chambers 105A and 105B may be coupled to the processing chamber 100 to provide a high throughput linear processing system. Each of the peripheral chambers 105A, 105B may be a processing chamber configured to perform the same or different process as the processing chamber 100, a transfer chamber, or other chamber configured to receive, send and/or process a substrate 108.

The processing chamber 100 comprises one or more processing sources, such as sources 110, chamber walls 102 that at least partially enclose a portion of a processing region 107, and at least a portion of a substrate automation system 115. A vacuum pump may be coupled to the processing chamber 100 to facilitate vacuum pressure within the processing region 107. Each of the sources 110 may include a deposition device, such as a gas distribution device having an energy source coupled thereto, which is configured to flow a precursor gas therethrough, and deliver energy to the gas in the processing region 107 and/or the substrates 108 to facilitate deposition of thin films on the substrates 108. In one configuration, the sources 110 each comprise a radiant source 111, such as an IR lamp, tungsten lamp, arc lamp, microwave heater or other radiant energy source that is configured to deliver energy to a surface of the substrates 108 disposed in the processing region 107 of the processing chamber 100 as they are transferred by the substrate automation system 115. In one embodiment, each of the sources 110 include a reflector 113. In some embodiments, the sources 110 include a gas distribution device 114 that supplies a precursor gas to a volume of the processing region 107 proximate to the source 110.

In one configuration, the substrate automation system 115 comprises a conveyor 116 that supports and transfers substrates 108 within and through the processing chamber 100.

The conveyor 116 may also facilitate transfer of substrates 108 between the processing chamber 100 and the peripheral chambers 105A, 105B through transfer ports 117. The transfer ports include a movable door 119A that is driven to open and close by an actuator 119B. The conveyor 116 of the substrate automation system 115 includes support rollers 112 that support and drive one or more continuous drive members 118 (only one is shown in the side view of FIG. 1). The continuous drive members 118 may comprise an endless drive member, such as a belt, a chain, or a cable. The endless drive member may be fabricated from metallic materials capable of withstanding the processing environment gases and temperatures endured by the substrates 108 during processing, such as stainless steel, aluminum, alloys thereof and combinations thereof. The one or more continuous drive members 118 may be coupled to a supporting material 109 that is configured to support the substrates 108 thereon. In one example, the supporting material 109 comprises a continuous web of material that provides friction between the substrates 108 and the supporting surface thereof, and is capable of withstanding exposure to the processing environment gases and temperatures endured by the substrates 108 during processing (e.g., a mesh of stainless steel or high temperature resistant polymeric materials). The peripheral chambers 105A, 105B may also include a conveyor that is similar to the conveyor 116 shown in the processing chamber 100.

At least one of the rollers 112 is configured to interface with the continuous drive member 118 to facilitate positive drive of the conveyor 116. Examples of configurations of the rollers 112 include a sheave, a pulley, or a sprocket. The rollers 112 may be electrically and/or mechanically driven by a common drive system (not shown) such that they are moved in unison. Alternatively, one of the rollers 112 may be coupled to a drive system (not shown) and the remainder of the rollers 112 may be idler rollers. The various drive signals for the rollers 112, transfer ports 117 and other system actuators are provided by a system controller.

During processing, the sources 110 of the processing chamber 100 can be used to deliver a desired amount of energy to the substrates 108 to heat the substrates 108 to a desired temperature for deposition of materials thereon. The desired temperature may be 300 degrees C., or greater, depending on the process. Elements within the processing region 107 are exposed to the provided heat and are made of materials having properties that resist failure under these conditions. However, the continuous drive members 118 may elongate proportionally with the temperature increase due to thermal expansion during initial heating of the chamber to the processing temperature, or after a shut-down and re-initiation of processing in the chamber. Depending on the length of the continuous drive members 118, the elongation may be substantial. The elongation of the continuous drive members 118 may cause slippage as well as unsteady and/or uncontrollable drive motion as the slack in the continuous drive members 118 compromises the interaction between the rollers 112 and the continuous drive members 118.

To mitigate the slack in the continuous drive members 118 caused by temperature induced elongation of the continuous drive members 118, one or more drive member supports 120 and 125 may be positioned to contact the continuous drive members 118. The drive member supports 120 and 125 provide support for the continuous drive members 118, and may also provide controllable tensioning of the continuous drive members 118. In one aspect, one or more of the drive member supports 120 may be configured solely for support and may be manually adjusted during maintenance intervals to take up slack in the continuous drive members 118. In one embodiment, the drive member support 125 is a temperature-compensating tensioner that continually takes up slack in the continuous drive members 118 in-situ during processing. The number and/or spacing of the drive member supports 120, 125 is only exemplary, and any one or combination of the drive member supports 120 and 125 may be used alone or in conjunction with other drive member supports and/or tensioners to form a tortuous path in the continuous drive members 118.

Figure 2:
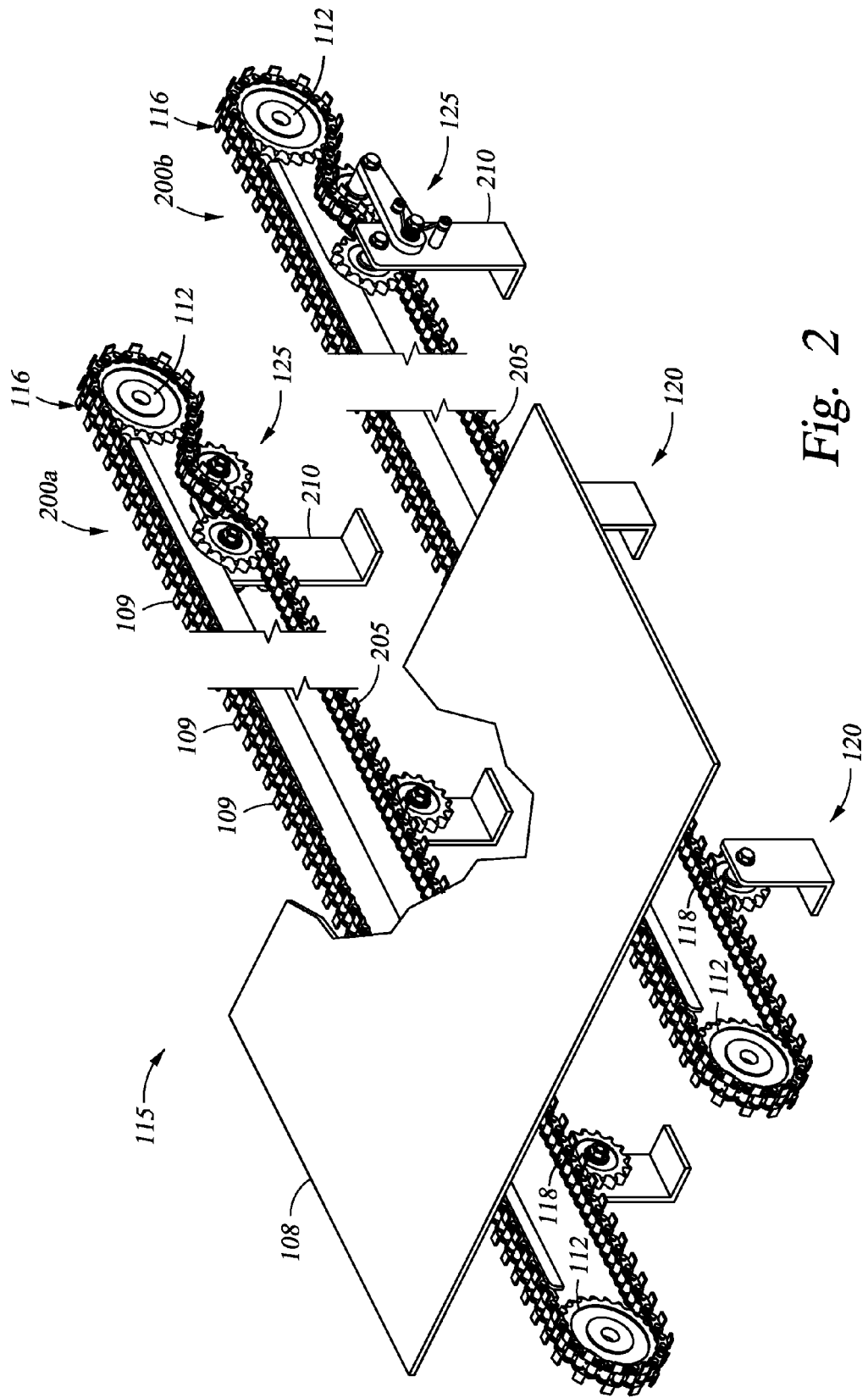
FIG. 2 is an isometric view of a substrate automation system showing one embodiment of conveyors that may be utilized in the processing chamber of FIG. 1, showing a substrate in partial breakaway thereon.

FIG. 2 is an isometric view of a portion of a substrate automation system 115 having one embodiment of conveyors 116 that may be utilized in the processing chamber 100 of FIG. 1. In this embodiment, each conveyor 116 comprises a first continuous drive member 200A and a second continuous drive member 200B. The first continuous drive member 200A and the second continuous drive member 200B may be spaced-apart a distance that facilitates support of a substrate 108 thereon. In this embodiment, each of the first continuous drive member 200A and the second continuous drive member 200B comprise a drive chain 205.

Each drive chain 205 is at least partially supported by rollers 112, which may comprise sprockets, and one or more drive member supports 120 and/or 125. In this embodiment, the drive member support 125 comprises a temperature-compensating tensioner 210. The temperature-compensating tensioner 210 may be actuated to tension the drive chain 205 according to temperature changes, which, in one embodiment, tensions the first continuous drive member 200A and the second continuous drive member 200B during temperature changes that may be encountered during processing in the processing chamber 100 of FIG. 1.

Figure 3:
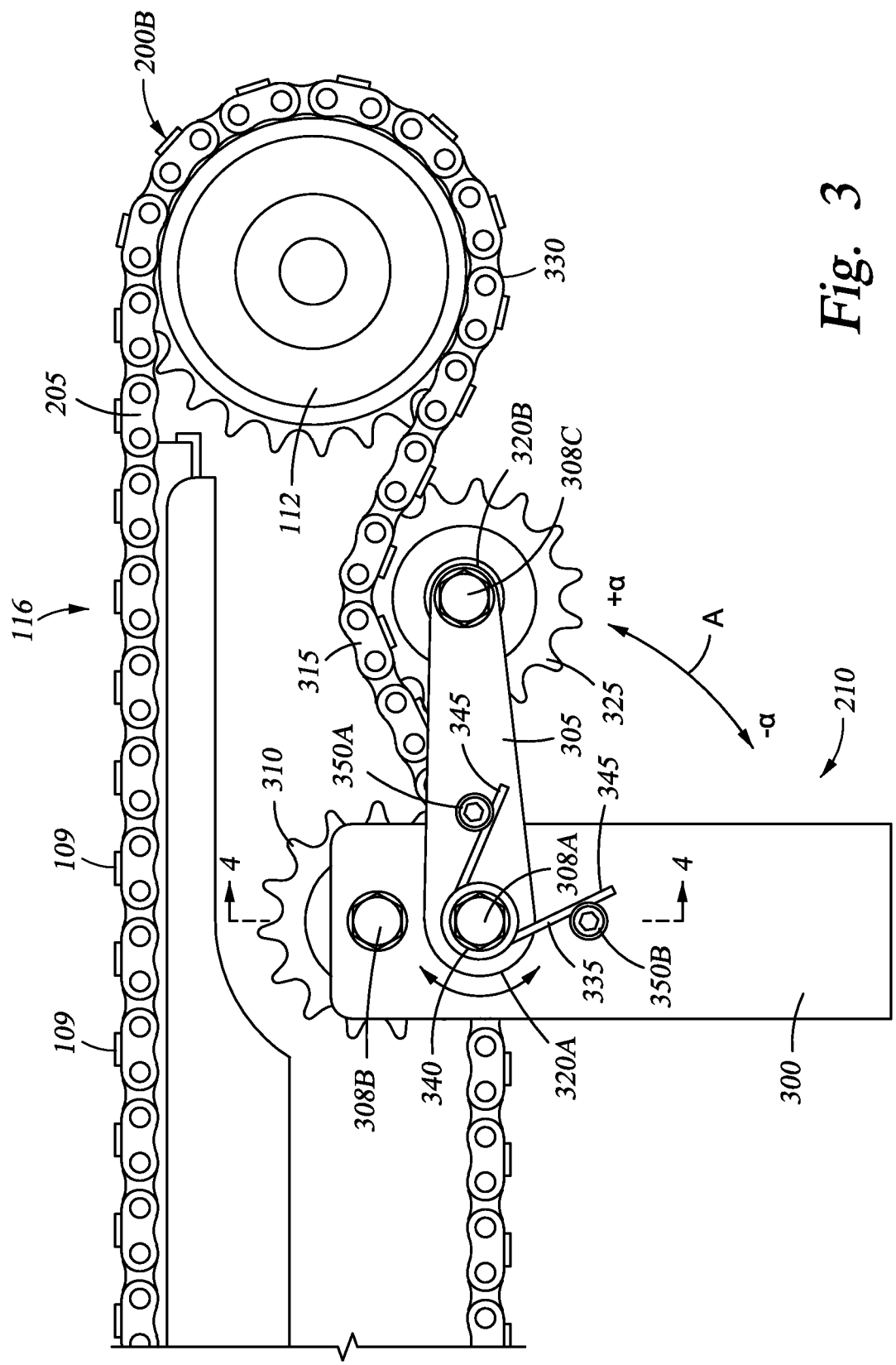
FIG. 3 is a side view of a portion of the continuous drive member of FIG. 2 having one embodiment of a temperature-compensating tensioner.

FIG. 3 is a side view of a portion of the continuous drive member 200B of FIG. 2. The temperature-compensating tensioner 210 comprises a fixed support member 300 and a movable support arm 305 that is pivotably coupled to the fixed support member 300 by a fastener 308A. The temperature-compensating tensioner 210 also includes a first idler roller 310 coupled to the fixed support member 300 by a fastener 308B. In one aspect, the periphery of the first idler roller 310 is adapted to interface with an inside surface 315 of the drive chain 205 of the continuous drive member 200B. The support arm 305 includes a proximal end 320A that is coupled to the fixed support member 300 and a distal end 320B having a second idler roller 325 coupled thereto by a fastener 308C. When the first idler roller 310 is adapted to contact the inside surface 315 of the drive chain 205, the periphery of the second idler roller 325 is adapted to interface with an outside surface 330 of the drive chain 205. However, the interface between the first idler roller 310 and the second idler roller 325 with the drive chain 205 may be changed such that the second idler roller 325 contacts the inside surface 315 of the drive chain 205 and the first idler roller 310 contacts the outside surface 330 of the drive chain 205.

The temperature-compensating tensioner 210 also includes a spring form 335 coupled between the fixed support member 300 and the support arm 305. The spring form 335 may be a shape-changing member that changes shape based on temperature fluctuations. The spring form 335 is coupled intermediate of the support arm 305 and the fixed support member 300 and is configured to bias the support arm 305 from the fixed support member 300. In one embodiment, the spring form 335 comprises a continuous wound spring member having a central loop region 340 that terminates at opposing ends 345. The opposing ends 345 are disposed on fasteners 350A, 350B configured as stops on the support arm 305 and the fixed support member 300, respectively. In one aspect, the spring form 335 changes shape based on temperature, which enables a variable spring constant of the spring form 335 during the shape change. This shape-change may provide a differential bias that may move the support arm 305 relative to the fixed support member 300 based on temperature. The variable spring constant enables a variable biasing (i.e., torque value) of the support arm 305 based on temperature, which may move the support arm 305 relative to the fixed support member 300. Movement of the support arm 305 causes the distal end 320B thereof, having the second idler roller 325 coupled thereto, to move in an arc A toward (+α direction) or away (−α direction) from the drive chain 205. Movement of the distal end 320B in the +α direction tensions the drive chain 205, while movement of the distal end 320B in the −α direction relieves tension on the drive chain 205.

In one embodiment, the temperature-compensating tensioner 210 provides minimal or no tension to the drive chain 205 when a length of the drive chain 205 is at a desired length at or near room temperature. However, in one aspect, as the length of the drive chain 205 increases with increasing temperature (due to thermal expansion); the temperature-compensating tensioner 210 maintains a pre-determined minimal tension on the drive chain 205. In another aspect, as the length of the drive chain 205 increases with increasing temperature, the temperature-compensating tensioner 210 provides a tensional force to the drive chain 205 that is substantially related (i.e., proportional) to the elongation of the drive chain 205.

For example, at temperatures at or near room temperature, the spring form 335 of the temperature-compensating tensioner 210 provides a negligible tensioning force to the drive chain 205. The negligible tensioning force may be a minimal force in the +α direction that provides contact between a surface of the second idler roller 325 and the drive chain 205. As the temperature of the drive chain 205 increases, the length of the drive chain 205, as well as the travel path of the drive chain 205, will increase due to thermal expansion of the material of the drive chain 205. The increase in length of the drive chain 205 causes slack in, and between, the drive chain 205 and the rollers 112. However, in one aspect, as the spring form 335 of the temperature-compensating tensioner 210 shares the same temperature environment of the drive chain 205, the spring form 335 maintains the minimal force in the +α direction such that contact between the surface of the second idler roller 325 and the drive chain 205 is maintained. Thus, slack is not created in the drive chain 205 due to the elongation in the drive chain 205. In another aspect, the spring form 335 may increase tension to a level slightly greater than the minimal force to further mitigate the slack in the drive chain 205. Thus, the temperature-compensating tensioner 210 gradually compensates for elongation of the drive chain 205 and/or the travel path of the drive chain 205, without additional, unnecessary tensional force on the drive chain 205 that may cause undue loading on the drive chain 205 and rollers 112. The temperature-compensating tensioner 210 therefore provides minimal tension to the drive chain 205 to ensure controllable operation of the conveyor 116 while also minimizing loading on the drive chain 205, which may shorten the service life of the conveyor 116.

Figure 4:
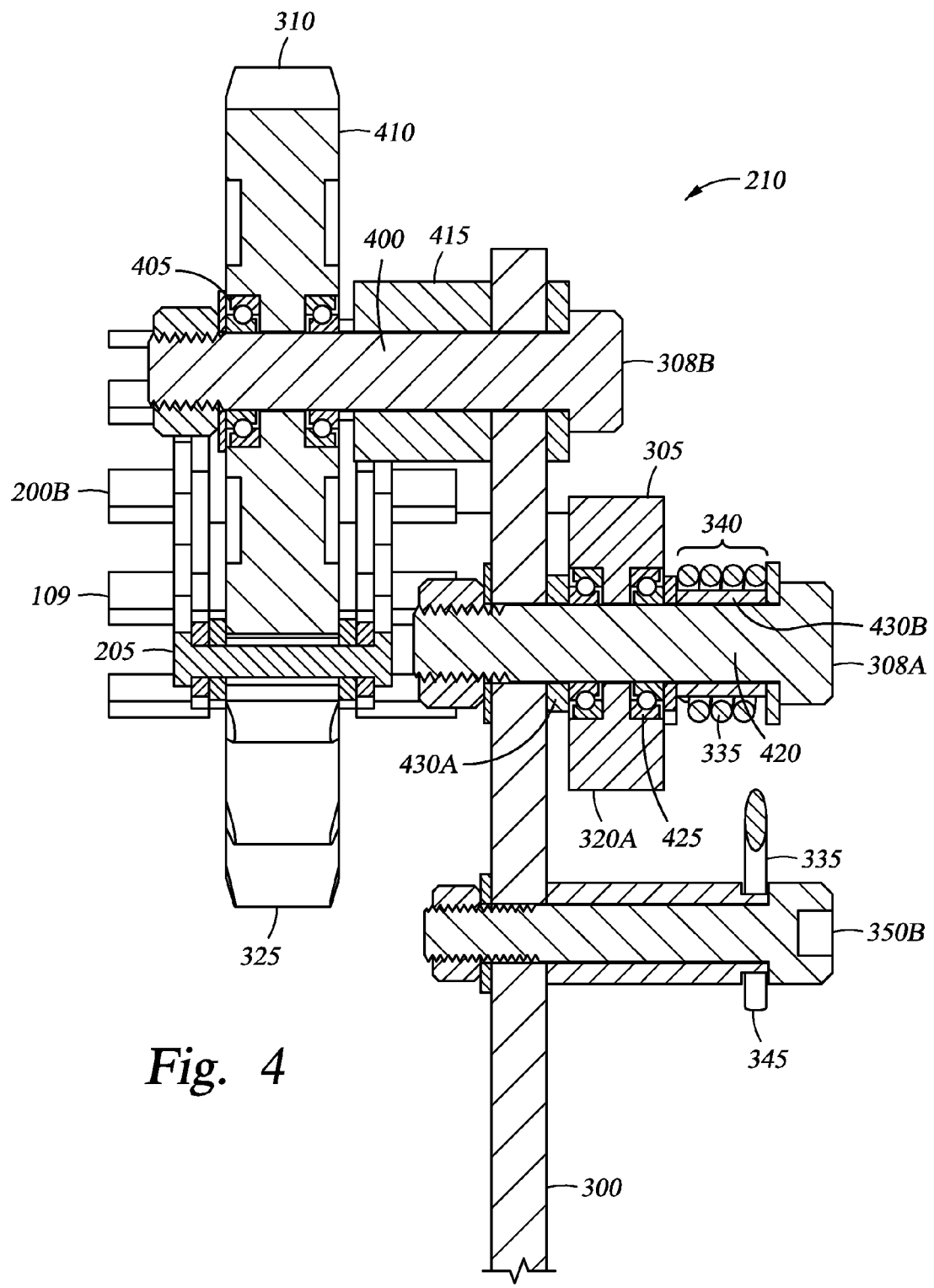
FIG. 4 is a sectional view of a portion of the temperature-compensating tensioner of FIG. 3.

FIG. 4 is a sectional view of a portion of the temperature-compensating tensioner 210 of FIG. 3. The first idler roller 310 of the temperature-compensating tensioner 210 is coupled to the fixed support member 300 by a shaft 400 of the fastener 308B. A bearing 405 is disposed intermediate of a body 410 of the first idler roller 310 and the shaft 400 to facilitate reduced friction therebetween. A bushing 415 may be disposed between the bearing 405 and a surface of the fixed support member 300 to maintain a desired spacing of the first idler roller 310 relative to the fixed support member 300. While the second idler roller 325 is not shown in this view, the second idler roller 325 may be coupled to the support arm 305 in a manner similar to the coupling of the first idler roller 310 to the fixed support member 300.

The support arm 305 is coupled to the fixed support member 300 by a shaft 420 of the fastener 308A. A bearing 425 is disposed intermediate of the support arm 305 and the shaft 420 to facilitate reduced friction therebetween. A first bushing 430A may be disposed between the bearing 425 and a surface of the fixed support member 300 to maintain a desired spacing of the support arm 305 relative to the fixed support member 300. A second bushing 430B may be disposed opposite the bearing 425 to provide a land area for the spring form 335. Opposing ends 345 of the spring form 335 (only one is shown) are fixed relative to the fixed support member 300 and the support arm 305 by fasteners 350B (only one is shown on the fixed support member 300 in this view). In one embodiment, the spring form 335 comprises a torsion spring. The size of the spring form 335 (i.e., diameter of the member comprising the spring form 335) and/or the number of loops in the central loop region 340 may be chosen based on the properties (i.e., length, size and/or weight) of the drive chain 205 such that a desired tension is applied thereto. The desired tension may be a negligible tensional force at room temperature.

The spring form 335 comprises a metallic material having at least two materials that are clad or otherwise joined to provide the spring form 335. In one embodiment, the spring form 335 comprises a bi-metallic material comprising a first material and a second material that is different from the first material. The first material may comprise a first crystal structure and the second material may comprise a second crystal structure that is different than the first crystal structure. Examples include a material comprising an austenitic structure clad with a material having a martensitic structure. The first material may include a first coefficient of thermal expansion (linear) (CTE) and a second material having a second CTE that is different than the first CTE. The CTE of the one of the first material or the second material may be about 1.5 times less than the CTE of the other material at a similar temperature. Examples of the first CTE include materials with a CTE of about 10.2 micrometers/meter-degrees C. ($\mu$m/m-° C.) at temperatures between about 0 degrees C. to about 100 degrees C. to about 12 $\mu$m/m-° C. at temperatures between about less than or equal to about 650 degrees C. Examples of the second CTE include materials having a CTE of about 16.9 $\mu$m/m-° C. at temperatures between about 0 degrees C. to about 100 degrees C. to about 18.7 $\mu$m/m-° C. at temperatures between about less than or equal to about 650 degrees C. The first material and the second material may be stainless steel. In one embodiment, the first material may be grade 304 stainless steel and the second material may be grade 420 stainless steel. The base material of the spring form 335 may comprise the material having the first CTE that is bonded to an outer layer comprising the material having the second CTE. In one embodiment, the base material of the spring form comprises a martensitic material while the outer layer disposed on the base material comprises an austenitic material. For example, the spring form 335 may comprise a base material comprising grade 420 stainless steel with a layer of grade 304 stainless steel bonded on the base material.

Figure 5:
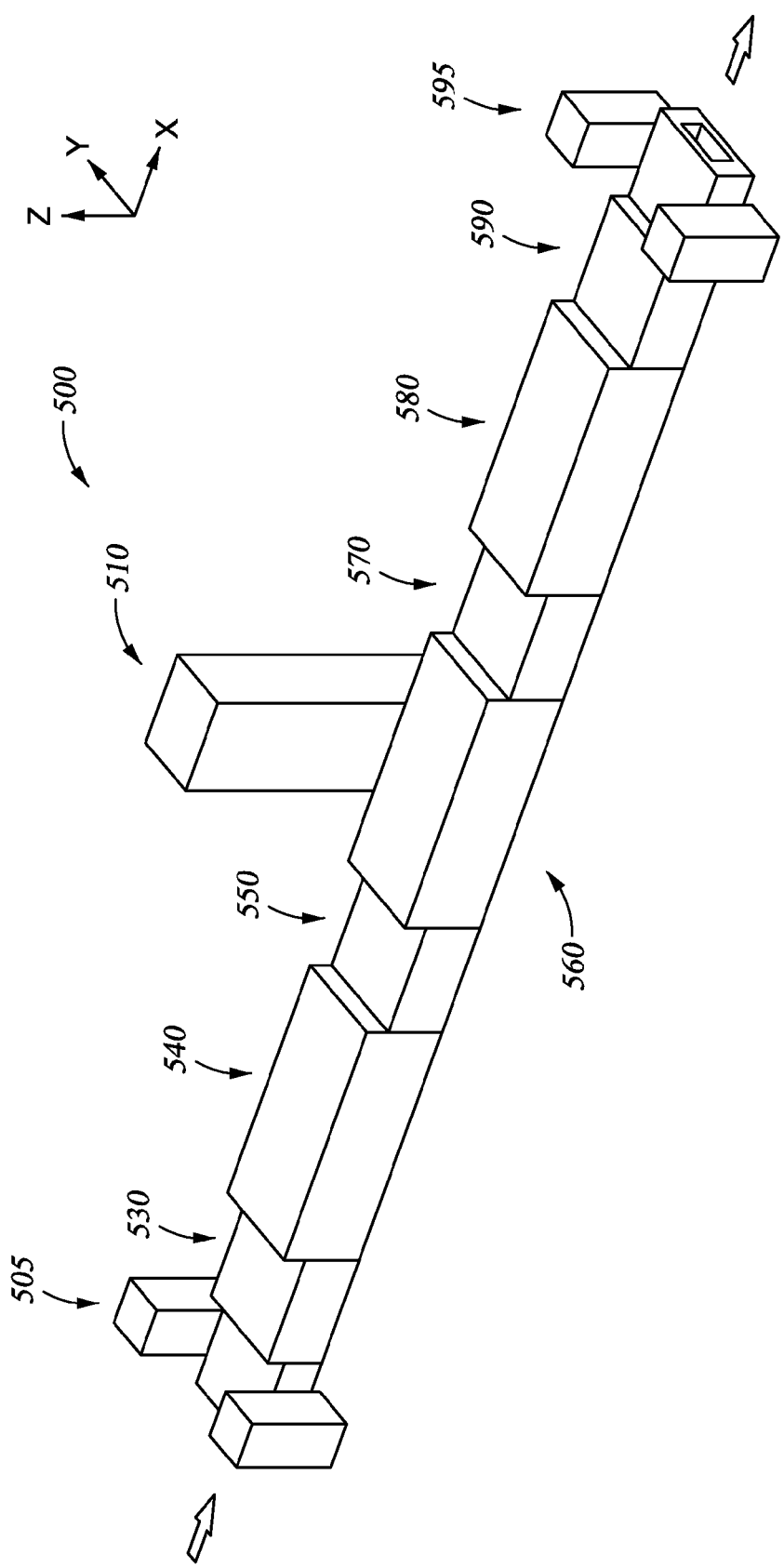
FIG. 5 is a schematic isometric view of one embodiment of a substrate processing system.

FIG. 5 illustrates a substrate processing system 500 for performing one or more solar cell fabrication processes on a linear array of substrates according to an embodiment of the present invention. In one embodiment, the substrate processing system 500 may include a substrate receiving chamber 505, a pre-processing chamber 530, at least one processing chamber, such as a first processing chamber 540, a second processing chamber 560, and a third processing chamber 580, at least one transferring chamber, such as transferring chambers 550 and 570, a buffer chamber 590 and a substrate unload chamber 595. Control of systems and sub-systems of the substrate processing system 500 may be provided by a system controller 510.

Collectively, the processing chambers 540, 560 and 580 may include one of the following types of chambers: PECVD chambers, LPCVD chambers, hot wire chemical vapor deposition (HWCVD) chambers, ion implant/doping chambers, plasma nitridation chambers, atomic layer deposition (ALD) chambers, physical vapor deposition (PVD) or sputtering chambers, plasma or vapor chemical etching chambers, thermal processing chambers (e.g., RTA or RTO chambers), substrate reorientation chambers (e.g., flipping chambers) and/or other similar processing chambers. One or more of the chambers may be cycled between ambient pressure and/or temperatures to processing pressures (e.g., about 1-100 milliTorr) and processing temperatures up to about 300 degrees C. to about 400 degrees C., or greater. One or more of the chambers may include a conveyor 116 as described herein having embodiments of the drive member supports 120 and 125 (shown in FIG. 1) and the temperature-compensating tensioner 210 (shown in FIGS. 2-4) to facilitate support and movement of substrates therein.

While the foregoing is directed to embodiments of the present invention, other and further embodiments of the invention may be devised without departing from the basic scope thereof, and the scope thereof is determined by the claims that follow.

The invention claimed is:

1. A temperature compensating chain tensioner, comprising:
   a fixed support member;
   a first idler sprocket coupled to the fixed support member, the first idler sprocket adapted to contact a continuous drive member;
   a support arm having a proximal end pivotably coupled to the fixed support member;
   a second idler sprocket coupled to a distal end of the support arm, the second idler sprocket adapted to contact the continuous drive member; and
   a spring form coupled intermediate of the fixed support member and the support arm, wherein the spring form has a shape that changes with temperature, which causes the distal end of the support arm to move relative to the fixed support member to maintain contact between the continuous drive member and the second idler sprocket when the temperature of the continuous drive member, the second idler sprocket and the spring form increases.

2. The chain tensioner of claim 1, wherein the spring form comprises a bi-metallic material.

3. The chain tensioner of claim 2, wherein the spring form comprises an austenitic material and a martensitic material.

4. The chain tensioner of claim 3, wherein the spring form comprises a torsion spring.

5. The chain tensioner of claim 2, wherein the spring form comprises a stainless steel material.

6. The tensioner of claim 5, wherein the stainless steel material comprises grade 304 stainless steel and grade 420 stainless steel.

7. The tensioner of claim 2, wherein the bi-metallic material comprises a first material having a first coefficient of thermal expansion and a second material having a second coefficient of thermal expansion that is different than the first coefficient of thermal expansion.

8. The tensioner of claim 7, wherein the first coefficient of thermal expansion is about 1.5 times greater than the second coefficient of thermal expansion.

9. A solar cell processing system, comprising:
a substrate automation system having one or more conveyors that are configured to transfer substrates serially through a processing region in a first direction, wherein each of the one or more conveyors comprises:
a continuous drive member supported by two or more rollers; and
a tensioner in communication with the continuous drive member that varies tension on the continuous drive member based on temperatures in the processing region.

10. The system of claim 9, wherein the tensioner comprises a spring form coupled between a fixed support member and a support arm.

11. The system of claim 10, wherein each of the fixed support member and the support arm comprise an idler roller that is in contact with the continuous drive member.

12. The system of claim 10, wherein the spring form comprises a bi-metallic material.

13. The system of claim 12, wherein the spring form comprises an austenitic material and a martensitic material.

14. The system of claim 12, wherein the spring form comprises a stainless steel material.

15. The system of claim 12, wherein the bi-metallic material comprises a first material having a first coefficient of thermal expansion and a second material having a second coefficient of thermal expansion that is different than the first coefficient of thermal expansion.

16. The system of claim 15, wherein the first coefficient of thermal expansion is about 1.5 times greater than the second coefficient of thermal expansion.

17. A method for processing one or more substrates, the method comprising:
transferring one or more substrates disposed on a continuous drive member through a processing region in a processing chamber; and
adjusting a tensional force applied to the continuous drive member based on temperature changes in the processing region.

18. The method of claim 17, wherein the adjusting the tensional force comprises a temperature-induced actuation of a roller against the continuous drive member.

19. The method of claim 17, wherein adjusting the tensional force applied to the continuous drive member is configured to compensate for a change in length of the continuous drive member when the temperature of the processing region changes.

20. The method of claim 19, wherein the adjusting the tensional force comprises an increased tensional force applied to the continuous drive member based on the increase in temperature of the processing region.

* * * * *

UNITED STATES PATENT AND TRADEMARK OFFICE
CERTIFICATE OF CORRECTION

PATENT NO. : 8,899,408 B2
APPLICATION NO. : 13/956631
DATED : December 2, 2014
INVENTOR(S) : Polyak It is certified that error appears in the above-identified patent and that said Letters Patent is hereby corrected as shown below:

In the Specification

Column 4, Line 5, delete "1198" and insert -- 119B -- therefor;

Column 6, Line 9, delete "(+a" and insert -- (+α -- therefor.

Signed and Sealed this
Ninth Day of June, 2015

Michelle K. Lee
*Director of the United States Patent and Trademark Office*